United States Patent
Okamoto et al.

(10) Patent No.: US 7,439,779 B2
(45) Date of Patent: Oct. 21, 2008

(54) DRIVER CIRCUIT

(75) Inventors: Tatuo Okamoto, Nagaokakyo (JP); Kang Tien Yew, Singapore (SG)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/988,661

(22) Filed: Nov. 16, 2004

(65) Prior Publication Data

US 2005/0110531 A1 May 26, 2005

(30) Foreign Application Priority Data

Nov. 21, 2003 (JP) .............................. 2003-391537

(51) Int. Cl.
*H03B 1/00* (2006.01)
*H03K 3/00* (2006.01)
(52) U.S. Cl. ..................................... 327/112
(58) Field of Classification Search ................. 327/108, 327/110, 112
See application file for complete search history.

(56) References Cited

U.S. PATENT DOCUMENTS

| | | | | |
|---|---|---|---|---|
| 4,636,748 A * | 1/1987 | Latham, II | .................... | 331/17 |
| 5,397,967 A | 3/1995 | Carobolante et al. | ........ | 318/254 |
| 6,147,545 A * | 11/2000 | Marshall | .................... | 327/424 |
| 6,838,900 B2 * | 1/2005 | Huang et al. | .................. | 326/30 |
| 2004/0041619 A1 * | 3/2004 | Nadd | .......................... | 327/436 |
| 2005/0185746 A1 * | 8/2005 | Jung | .......................... | 375/374 |

FOREIGN PATENT DOCUMENTS

| | | |
|---|---|---|
| JP | 02-241368 | 9/1990 |
| JP | 6-90589 | 3/1994 |
| JP | 03-052194 | 2/2003 |
| JP | 03-158868 | 5/2003 |
| JP | 03-524921 | 8/2003 |
| WO | WO 00/27032 | 5/2000 |

* cited by examiner

*Primary Examiner*—Quan Tra
(74) *Attorney, Agent, or Firm*—Steptoe & Johnson LLP

(57) ABSTRACT

A driver circuit for driving a load (3) connected between an output (FO) of a first channel driver (D1) and an output (RO) of a second channel driver (D2). The first and second channel drivers (D1, D2) each include switch transistors for charging and discharging the gates of upper and lower output transistors in response to a command from an input pulse, a charging/discharging circuit (A2, B2) for determining a charging/discharging speed, and a detector circuit (A1, B1) for detecting a state of the channel driver on the opposite side. A dead time period and a speed of charging/discharging the gates of the upper and lower output transistors are changed according to the state of the channel driver on the opposite side. Thus, it is possible to achieve a channel driver circuit which can prevent a shoot-through current, adjust an output slew rate, and obtain preferred linearity as an input-output characteristic.

6 Claims, 14 Drawing Sheets

DRIVER CIRCUIT

FIELD OF THE INVENTION

The present invention relates to a driver circuit used for a channel driver and so on. To be specific, the present invention relates to a circuit technique for preventing a shoot-through current of an output driver, adjusting an output slew rate, and obtaining preferred linearity.

BACKGROUND OF THE INVENTION

FIG. 11 shows a conventional channel driver circuit of PWM through system.

Reference numeral 1 denotes a timing pulse generator on side A that generates a pulse for driving an output transistor from an input pulse INA. Reference numeral 2 denotes an output driver circuit on side A. Reference numeral 3 denotes a load. Reference numeral 5 denotes a timing pulse generator on side B that generates a pulse for driving an output transistor from an input pulse INB. Reference numeral 4 denotes an output driver circuit on side B.

The output driver circuit 2 is configured as shown in FIG. 12.

Reference numerals 11, 12, 14, and 15 denote resistors or current sources for determining a speed of charging/discharging the gates of output transistors 41 and 42. Reference numerals 31 and 34 denote P-type switch transistors for determining, based on pulses AF⁻ and AD⁻ from the timing pulse generator 1, timing of charging the gates of the output transistors 41 and 42. Reference numerals 32, 33, 35, and 36 denotes N-type switch transistor for determining, based on pulses AE, AF, AG, and AD from the timing pulse generator 1, timing of discharging the gates of the output transistors 41 and 42. Reference numerals 51 and 52 denote diodes for imposing a limit in such a way that a reverse voltage between the gate and source of the output transistor 41 on the upper side does not exceed the withstand voltage of the output transistor 41. Side B has completely the same configuration as side A.

FIG. 13 is a timing chart for driving the output driver circuit 2 of FIG. 12. Side B has completely the same configuration as side A.

As shown in FIG. 13, delay pulses indicated by AD and AD⁻ and delay pulses indicated by AF and AF⁻ are generated from the input pulse INA to provide dead times d1 and d2, thereby preventing a shoot-through current. As shown in FIG. 13, because of the presence of the dead times d1 and d2, the waveform of an output FO differs according to the voltage of an output terminal RO on side B. The functions of the dead times d1 and d2 include a buffer or a level shift, in which the input pulse is outputted as it is to an output terminal. The load 3 of the output is a resistor, a coil, and so on. Such a configuration is disclosed in Japanese Patent Laid-Open No. 6-90589 and so on.

It is an object of the conventional art to prevent a shoot-through current and obtain a desired output slew rate and preferred linearity when an output voltage changes in a driver circuit used for a channel driver and so on.

A shoot-through current poses a significant danger because a large current flows from a power supply to the ground and generates heat. Further, an extremely high output slew rate causes extraneous radiation and an extremely low output slew rate results in an endless change of an output waveform during the dead time and causes a shoot-through current.

Regarding linearity, the dead time reduces a gain and degrades linearity when a duty difference is small between PWM input pulses on both sides, that is, in an area where a small current passes through the load 3. Such a phenomenon makes it difficult to finely control the load 3 of an actuator and so on.

DISCLOSURE OF THE INVENTION

The present invention is devised in order to solve the conventional problem. An object of the present invention is to provide a driver circuit which causes no shoot-through current and obtains a desired output slew rate and preferred linearity.

According to the present invention, a driver circuit for driving a load connected between the output of a first channel driver and the output of a second channel driver is characterized in that the first and second channel drivers each comprises: a charging/discharging circuit comprising a switch transistor for charging and discharging gates of upper and lower output transistors in response to a command from an input pulse, and a circuit for determining a charging/discharging speed for each gate; and a detector circuit for detecting a state of the channel driver on the opposite side, wherein a change is made to a dead time period and the speed of charging/discharging the gates of the upper and lower output transistors, according to the state of the channel driver on the opposite side.

With this configuration, it is possible to prevent a through current, adjust an output slew rate, and obtain preferred linearity as an input-output characteristic.

DESCRIPTION OF THE EMBODIMENTS

The following will describe the present invention according to embodiments below.

Embodiment 1

FIGS. 1 to 6 show (Embodiment 1) of the present invention.

Figure 11:
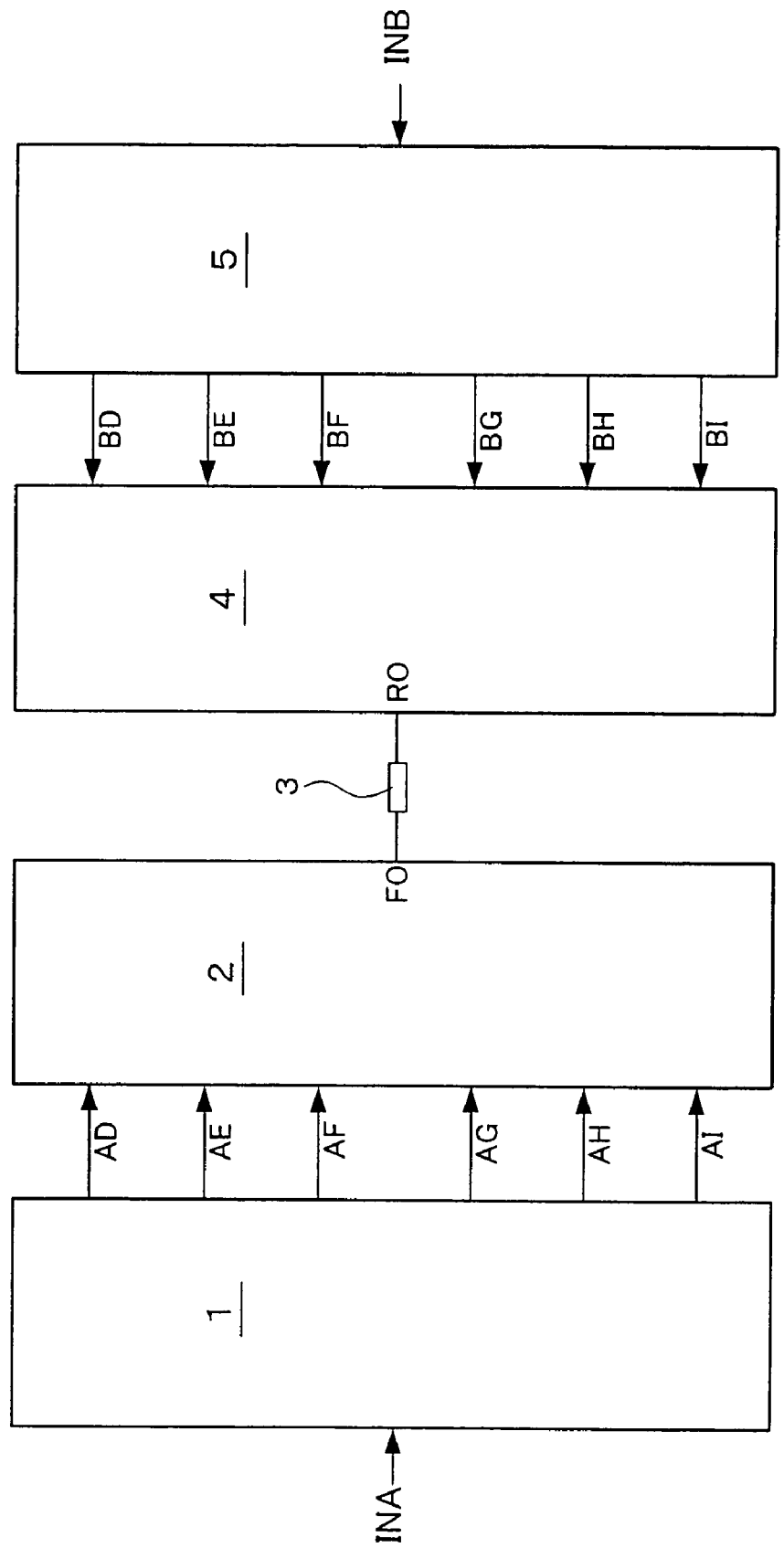
FIG. 11 is a block diagram showing conventional output drivers.
Figure 12:
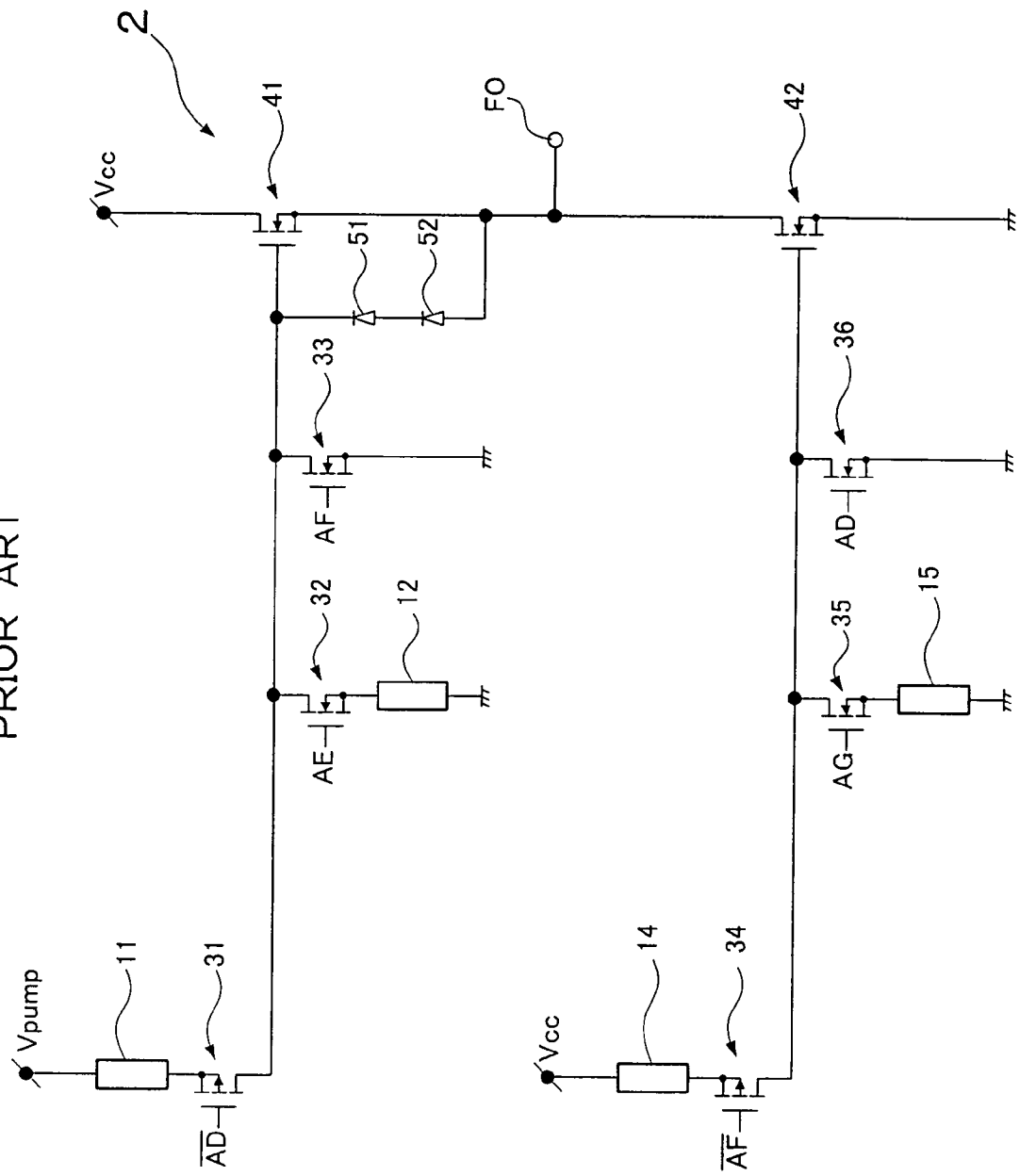
FIG. 12 is a diagram showing a conventional output driver circuit.

Constituent elements act as those of FIGS. 11 and 12 showing the conventional art are indicated by the same reference numerals.

Figure 1:
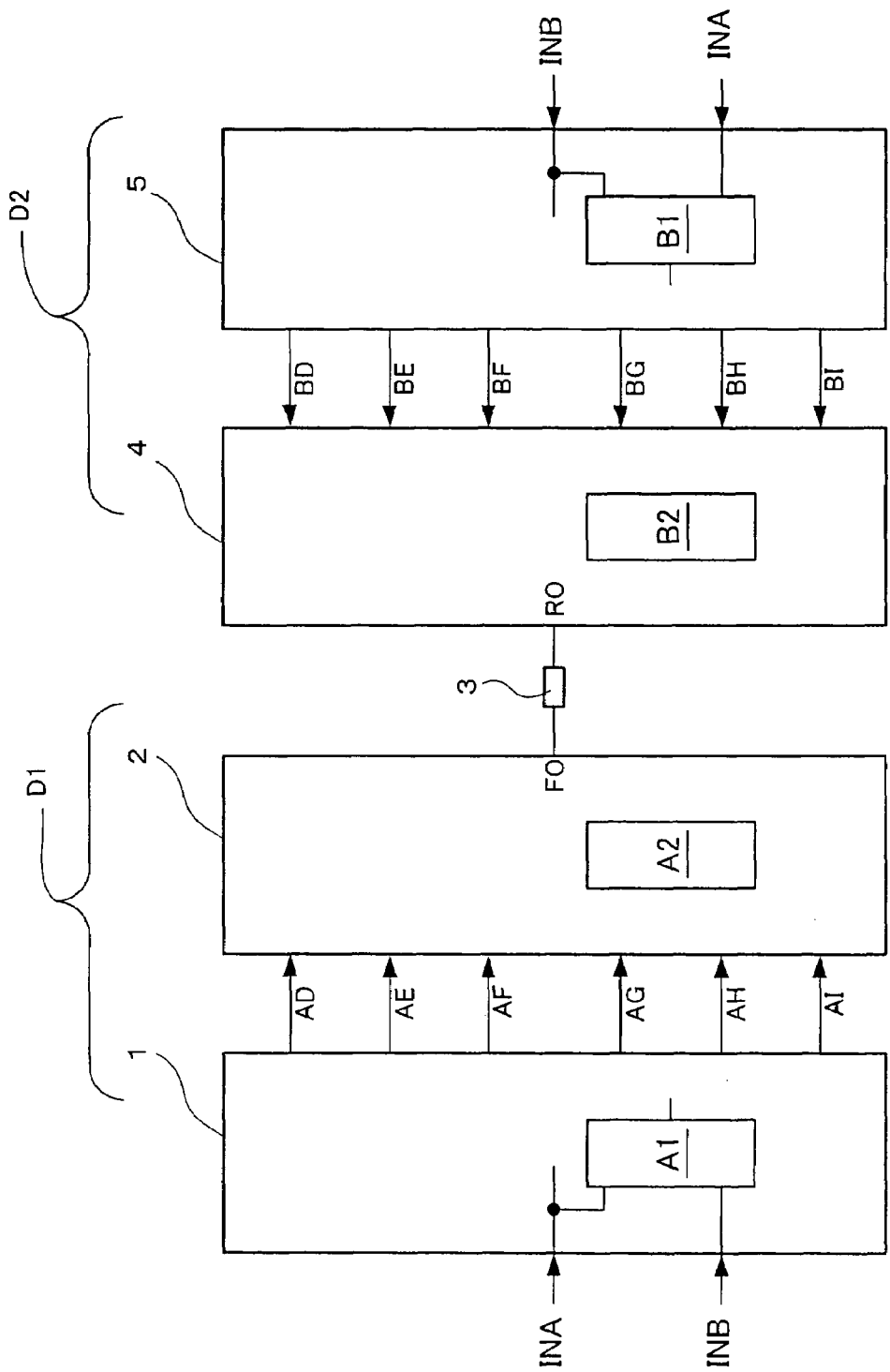
FIG. 1 is a block diagram showing an output driver according to (Embodiment 1) of the present invention.
Figure 2:
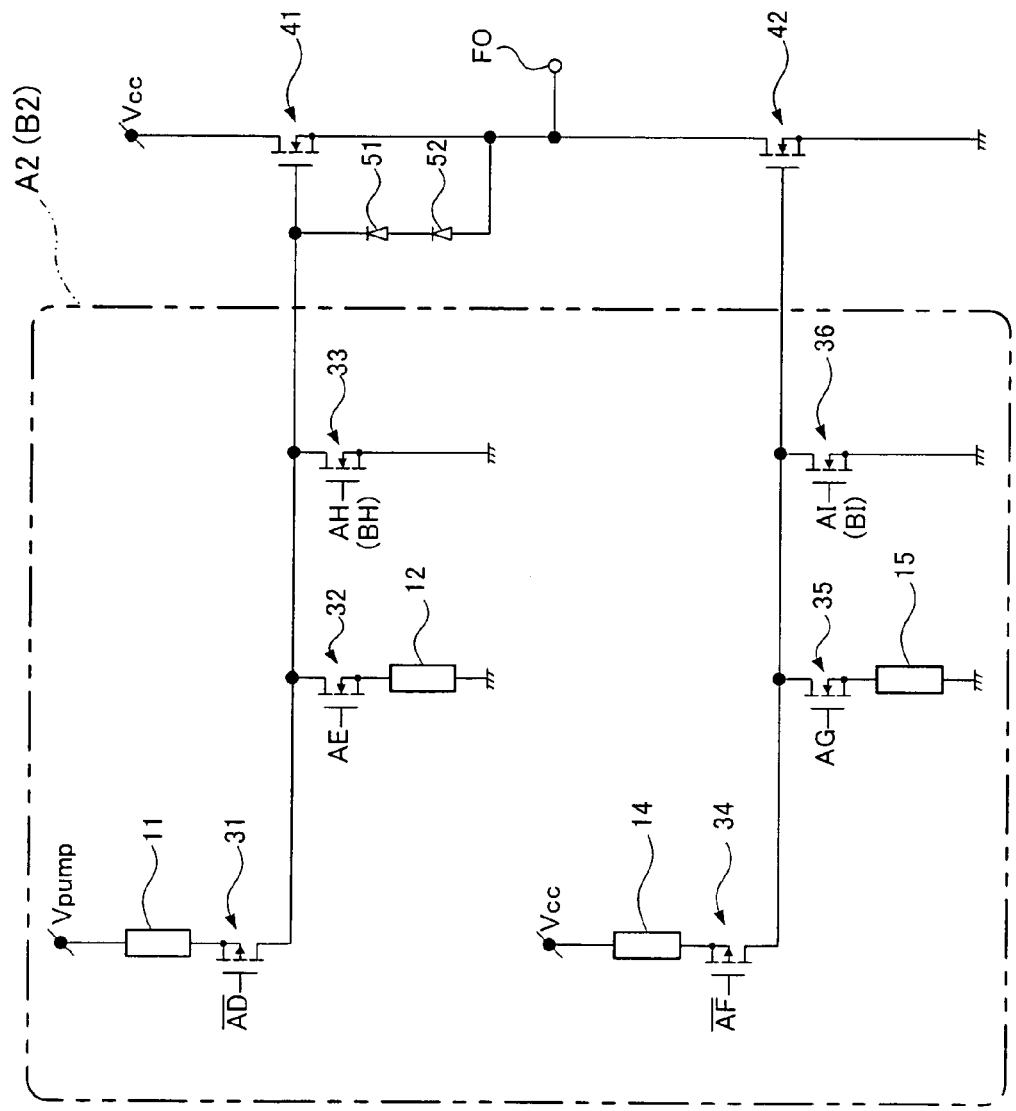
FIG. 2 is a diagram showing a driver circuit according to (Embodiment 1) of the present invention.
Figure 13:
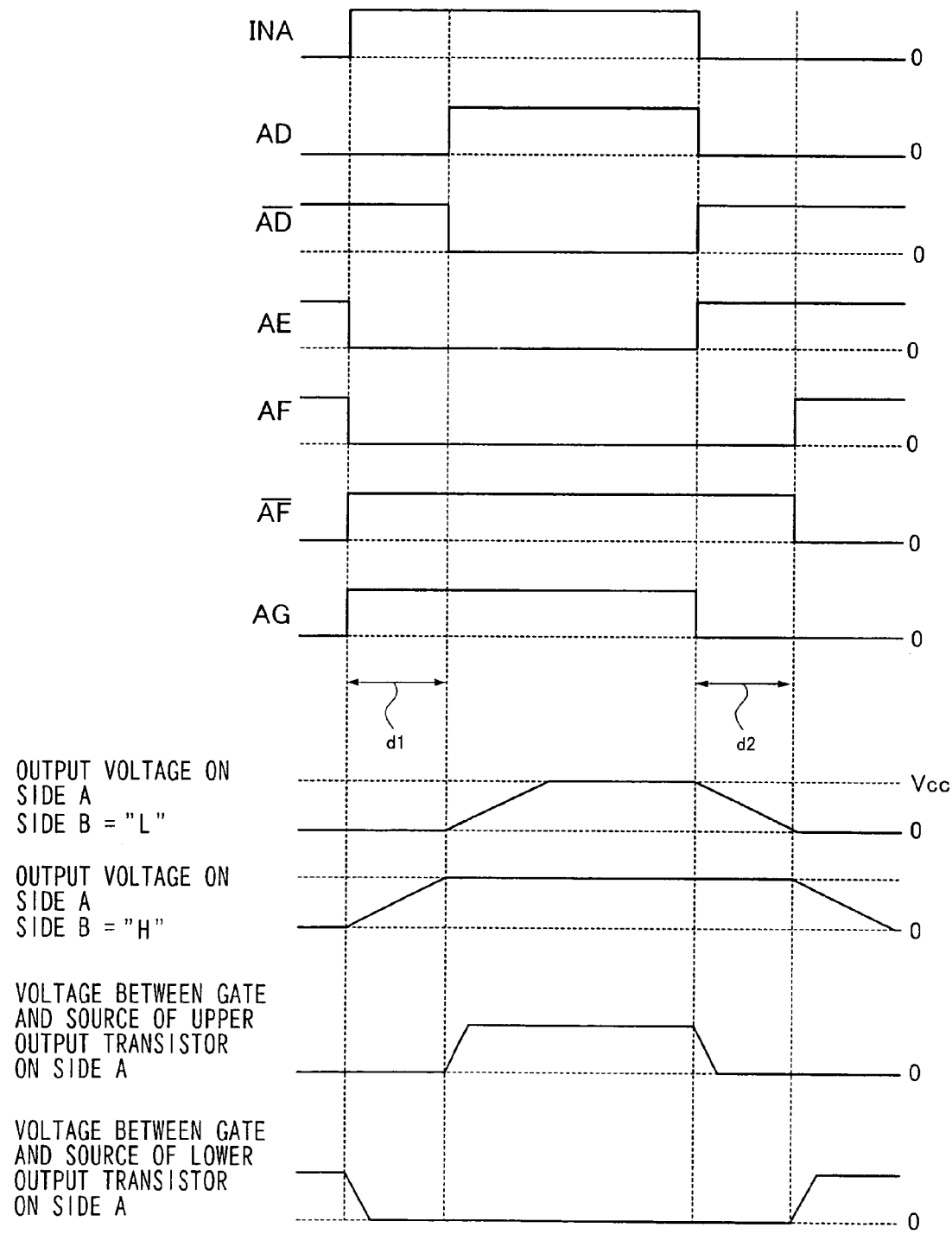
FIG. 13 is a timing chart which shows driving pulses to explain the operations of FIG. 11.

FIG. 1 shows a driver circuit of (Embodiment 1). FIG. 2 shows the detail of an output driver circuit on side A of FIG. 1. In FIG. 11 showing the conventional art, only the input pulse INA is supplied as an input signal to the timing pulse generator 1 on side A and only the input pulse INB is supplied as an input signal to the timing pulse generator 5 on side B; whereas in FIG. 1 showing (Embodiment 1), input pulses INA and INB are supplied to both of a timing pulse generator 1 on side A and a timing pulse generator 5 on side B. As shown in FIG. 2, instead of the pulses AF and AD shown in FIGS. 12 and 13, pulses AH and AI (described later) are applied to the gates of N-type switch transistors 33 and 36.

The detail will be discussed below.

The driver circuit drives a load 3 connected between an output FO of a first channel driver D1 and an output RO of a second channel driver D2. Reference numeral 1 denotes the timing pulse generator which generates driving pulses for charging and discharging the gates of upper and lower output transistors in response to a command from the input pulse INA on side A. Reference numeral 2 denotes a driver circuit for applying a power supply voltage or 0 volt to the load 3. In PWM through system, side A and side B have symmetrical configurations. An output driver circuit 4 on B side is constituted of the same circuits as the output driver circuit 2 on side A, and the timing pulse generator 5 on side B is constituted of completely the same circuits as the timing pulse generator 1 on side A. The configurations will be discussed below.

For simple explanation, only one side (side A) Will be discussed below.

FIG. 2 shows the detail of the output driver circuit 2. Reference numerals 11, 12, 14, and 15 denote resistors or current sources for determining a speed of charging/discharging the gates of output transistors 41 and 42. Reference numerals 31 and 34 denote P-type switch transistors for determining the charging timing based on pulses AF⁻ and AD⁻ from the timing pulse generator 1. Reference numerals 32, 33, 35, and 36 denote N-type switch transistors for determining the discharging timing based on pulses AE, AH, AG, and AI from the timing pulse generator 1. Reference numerals 51 and 52 denote diodes for imposing a limit in such a way that a reverse voltage between the gate and source of the output transistor 41 on the upper side does not exceed the breakdown voltage of the output transistor 41. Reference character FO denotes the output terminal for driving the load 3. FIG. 2 shows, as a charging/discharging circuit A2, the switch transistors 31 to 33 and 34 to 36 for charging and discharging the gates of the upper and lower output transistors 41 and 42 in response to a command from the input pulse INA and the circuit for determining the charging/discharging speed. Also on side B, as a charging/discharging circuit B2, switch transistors are provided for charging and discharging the gates of the upper and lower output transistors in response to a command from the input pulse INB and the circuit is provided for determining the charging/discharging speed.

Figure 3:
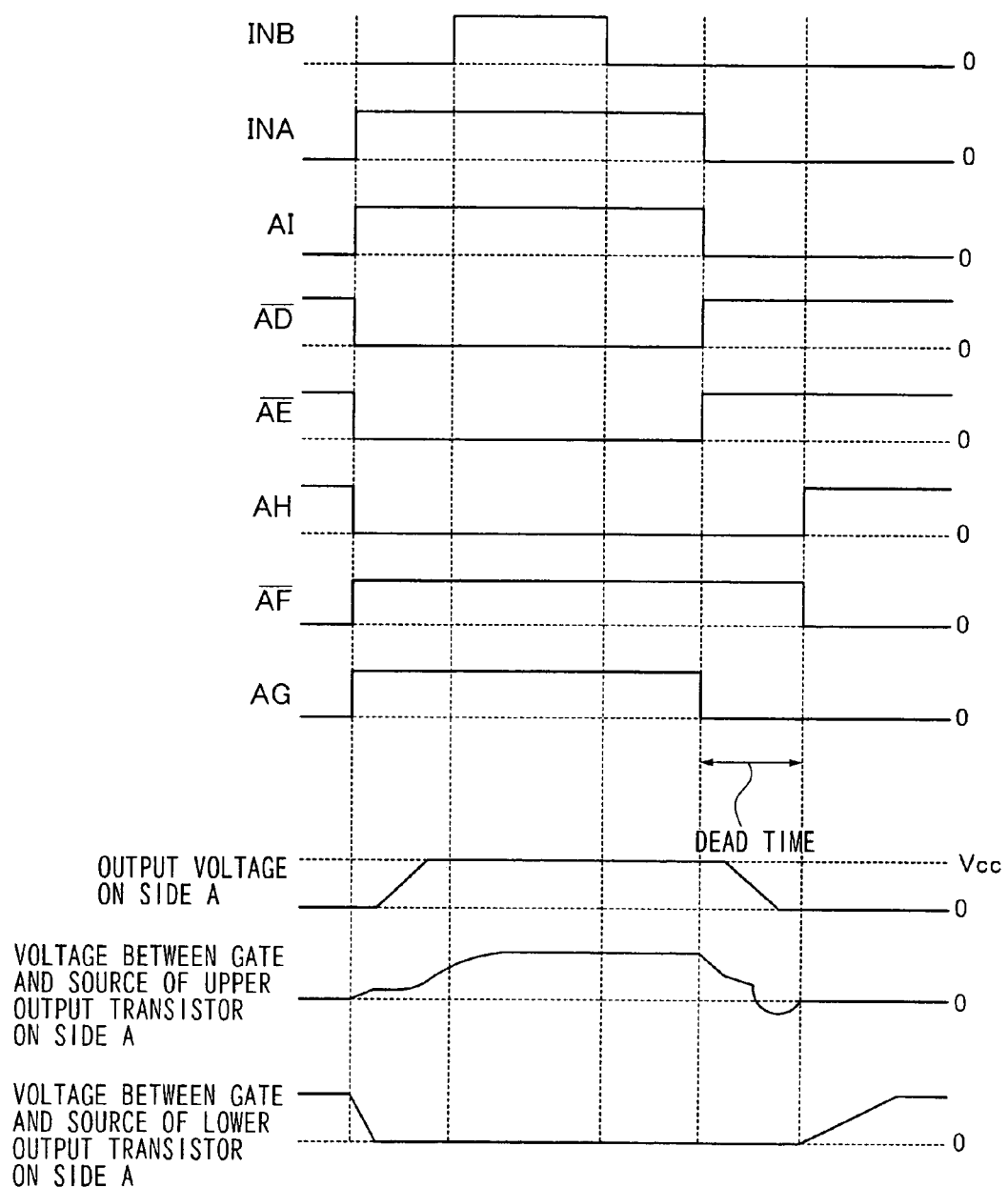
FIG. 3 is a timing chart which shows driving pulses on side A to explain the operations of FIG. 1.
Figure 4:
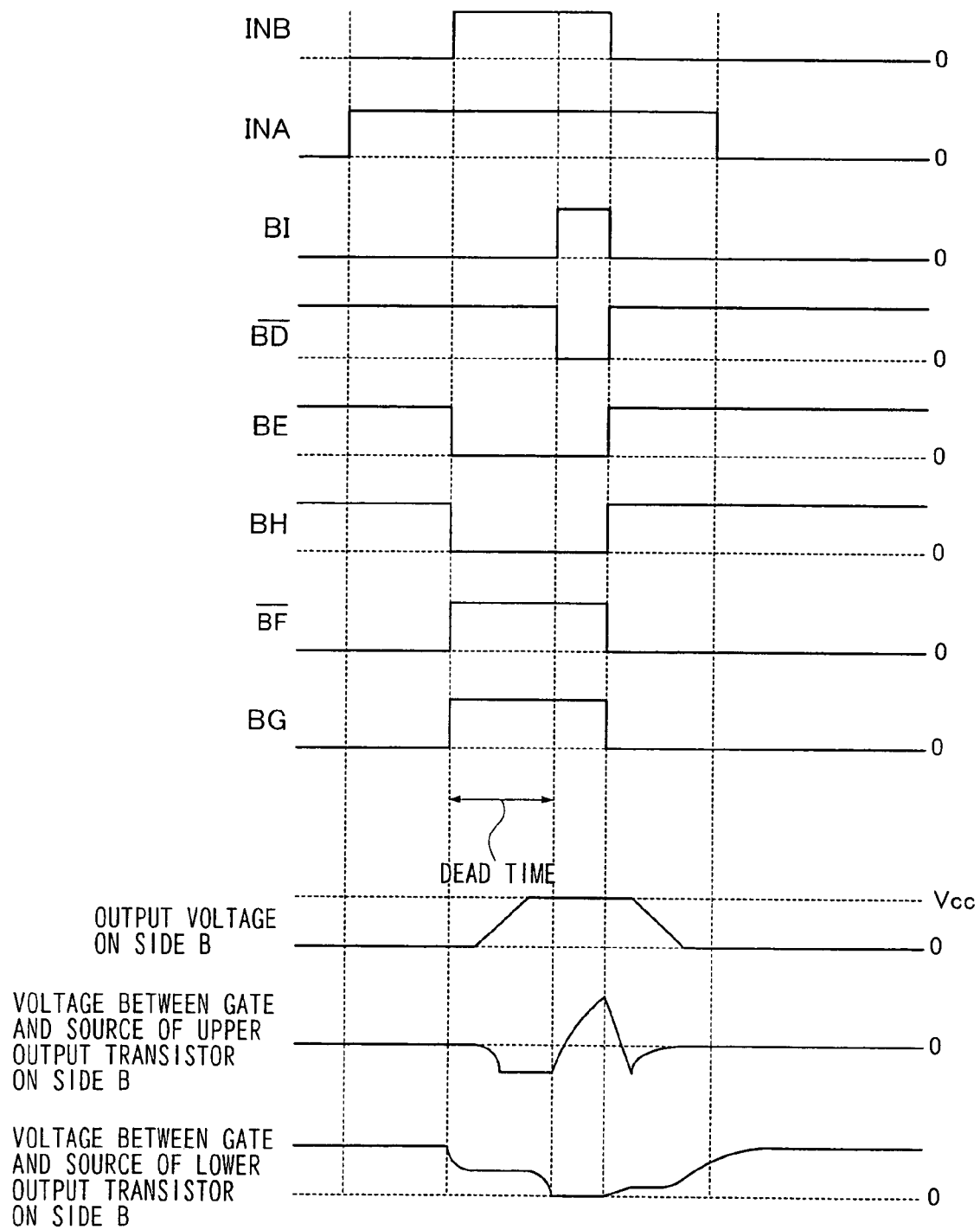
FIG. 4 is a timing chart which shows driving pulses on side B to explain the operations of FIG. 1.
Figure 5:
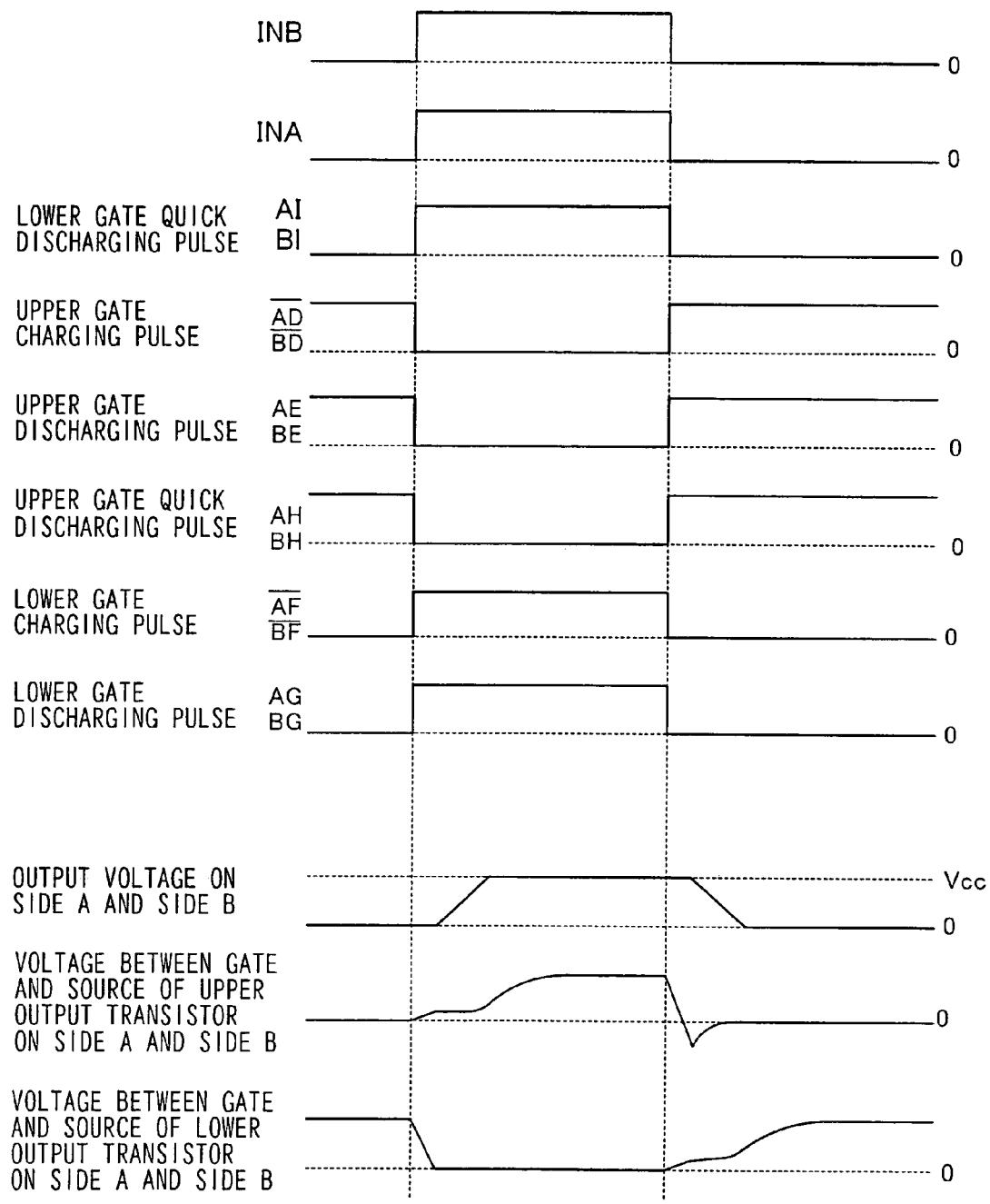
FIG. 5 is a timing chart showing the driving pulses on the side A and side B when both inputs have substantially the same pulse (duty=50%)

Referring to the timing charts of FIGS. 3 to 5, the following will discuss the operations of the driver circuit configured thus according to (Embodiment 1). The driver circuit has a detector circuit A1 in the timing pulse generator 1. Driving pulse timing differs according to whether the input pulse INB on side B, which is the opposite side, is set at "H" or "L". Also on side B, a detector circuit B1 is provided in the timing pulse generator 5. Driving pulse timing differs according to whether the input pulse INA on side A, which is the opposite side, is set at "H" or "L".

FIGS. 3 and 4 shows the timing of the driving pulses when side A has a higher duty than side B does. FIG. 5 shows the timing of the driving pulses when side A and side B are almost equal in pulse width (duty=about 50%).

In this case, in FIGS. 3 and 4, the input of side B is always set at "L" at the rising edge and falling edge of side A. On side B, the input of side A is always set at "H" at the rising edge and falling edge of side B. Thus, as shown in FIGS. 3 and 4, the driving pulses differ between side A and side B. When the duty of side A is lower than that of side B, this state is equivalent to interchanged pulses between side A and side B. Hence, it is understood that FIGS. 3 to 5 cover all the cases.

In FIG. 3, the inverted pulse AD⁻ of the pulse AD is a driving pulse for charging the gate of the upper output transistor 41. A rising slew rate of the output (FO) is determined by the resistors or the current source 11 when the input pulse INB on the opposite side is set at "L". The pulse AE is a driving pulse for discharging the gate of the upper output transistor 41. A falling slew rate of the output FO is determined by the resistors or the current source 12 when the input pulse INB on the opposite side is set at "L". The pulse AH is a driving pulse for quickly discharging the gate of the upper output transistor 41. The upper output transistor 41 is quickly turned off by turning on the transistor 33 when the input pulse INB on the opposite side is set at "H", thereby preventing a shoot-through current passing through the output transistors 41 and 42.

The inverted pulse AF− of the pulse AF is a driving pulse for charging the gate of the lower output transistor 42. A falling slew rate of the output FO is determined by the resistors or the current source 14 when the input pulse INB on the opposite side is set at "H". The pulse AG is a driving pulse for discharging the gate of the lower output transistor 42. A rising slew rate of the output FO is determined by the resistors or the current source 15 when the input pulse INB on the opposite side is set at "H". The pulse AI is a driving pulse for quickly discharging the gate of the lower output transistor 42. The lower output transistor 42 is quickly turned off by turning on the transistor 36 when the input pulse INB on the opposite side is set at "L", thereby preventing a shoot-through current passing though the output transistors 41 and 42.

When the input pulse INB on the opposite side is set at "H", dead time is not provided at the falling edge of the input pulse INA and the transistors 32, 33, and 34 are turned on at the same time. Before exceeding a threshold voltage (e.g., 0.7 V) for turning on the voltage between the gate and source of the lower output transistor 42, the gate of the upper output transistor 41 is quickly discharged to a threshold voltage or lower for turning on the voltage between the gate and source of the upper output transistor 41, thereby causing no shoot-through current.

When the input pulse INB on the opposite side is set at "L", dead time is not provided at the rising edge of the input pulse INA and the transistors 31, 35, and 36 are turned on at the same time. Before exceeding a threshold voltage (e.g., 0.7 V) for turning on the voltage between the gate and source of the upper output transistor 41, the gate of the lower output transistor 42 is quickly discharged to a threshold voltage or lower for tuning on the voltage between the gate and source of the lower output transistor 42, thereby causing no shoot-through current.

When the input pulse INB on the opposite side is set at "L", dead time is provided at the falling edge of the input pulse INA. First, the transistor 32 is turned on by the driving pulse AE, so that the voltage between the gate and source of the upper output transistor 41 is gradually discharged and the output transistor 41 is gradually shifted from ON state to OFF state. At this point, since the output RO on the opposite side B is set at "L", the output (FO) on side A is also shifted from "H" to "L" at a desired slew rate by adjusting the value of the resistors or the current source 12. After the output FO on side A falls sufficiently and the dead time elapses, the gate of the lower output transistor 42 is charged by the inverted pulse $AF^-$ of the pulse AF to turn on the lower output transistor 42 and synchronous rectification is performed. At this point, the output FO on side A falls, regardless of the dead time, when the upper output transistor 41 is turned off. That is, the output indicates completely the same characteristic as the absence of the dead time.

When the input pulse INB on the opposite side is set at "H", the dead time is provided at the rising edge of the input pulse INA. First, the transistor 35 is turned on by the pulse AG, so that the voltage between the gate and source of the lower output transistor 42 is gradually discharged and the output transistor 42 is gradually shifted from ON state to OFF state. At this point, since the output RO on the opposite side B is set at "H", the output FO on side A is also shifted from "L" to "H" at a desired slew rate by adjusting the value of the resistors or the current source 15. After the output FO on side A rises sufficiently and the dead time elapses, the gate of the upper output transistor 41 is charged by the inverted pulse $AD^-$ of the pulse AD to turn on the upper output transistor 41 and synchronous rectification is performed. At this point, the output FO on side A falls, regardless of the dead time, when the lower output transistor 42 is turned off. That is, the output indicates completely the same characteristic as the absence of the dead time.

FIG. 5 shows the case where both of the input pulses (INA, INB) have a duty close to 50%.

When side A and side B are nearly equal in input pulse width (duty=about 50%), rising and falling occur almost at the same time. Thus, the dead time is not provided at the rising edge or the falling edge and the gates of the upper output transistor 41 and the lower output transistor 42 on sides A and B are quickly discharged simultaneously by the action of the quick discharging pulses (AH, BH, AI, and BI), thereby preventing a shoot-through current. At this point, the outputs (FO, RO) rise and fall almost at the same time. Thus, even when the gates of the output transistors 41 and 42 are discharged quickly, a slew rate is not increased too high according to the output of the opposite side. That is, the slew rate is determined by the resistors or the current source 11 and 14 which determine a speed of charging the gates of the output transistors 41 and 42.

The driving pulses can be readily generated from the input pulses INA and INB, which are command pulses on both sides, by a combinational logic and a delay circuit constituted of a resistor and a capacitance or a delay circuit constituted of a clock and a flip-flop.

In this way, a state of the input on the opposite side determines whether the dead time is present or absent at the rising edge and the falling edge and whether the gate of the output transistor is quickly discharged or not, and thus it is possible to prevent a shoot-through current and obtain a desired slew rate and an input-output characteristic of dead time=0.

Figure 6:
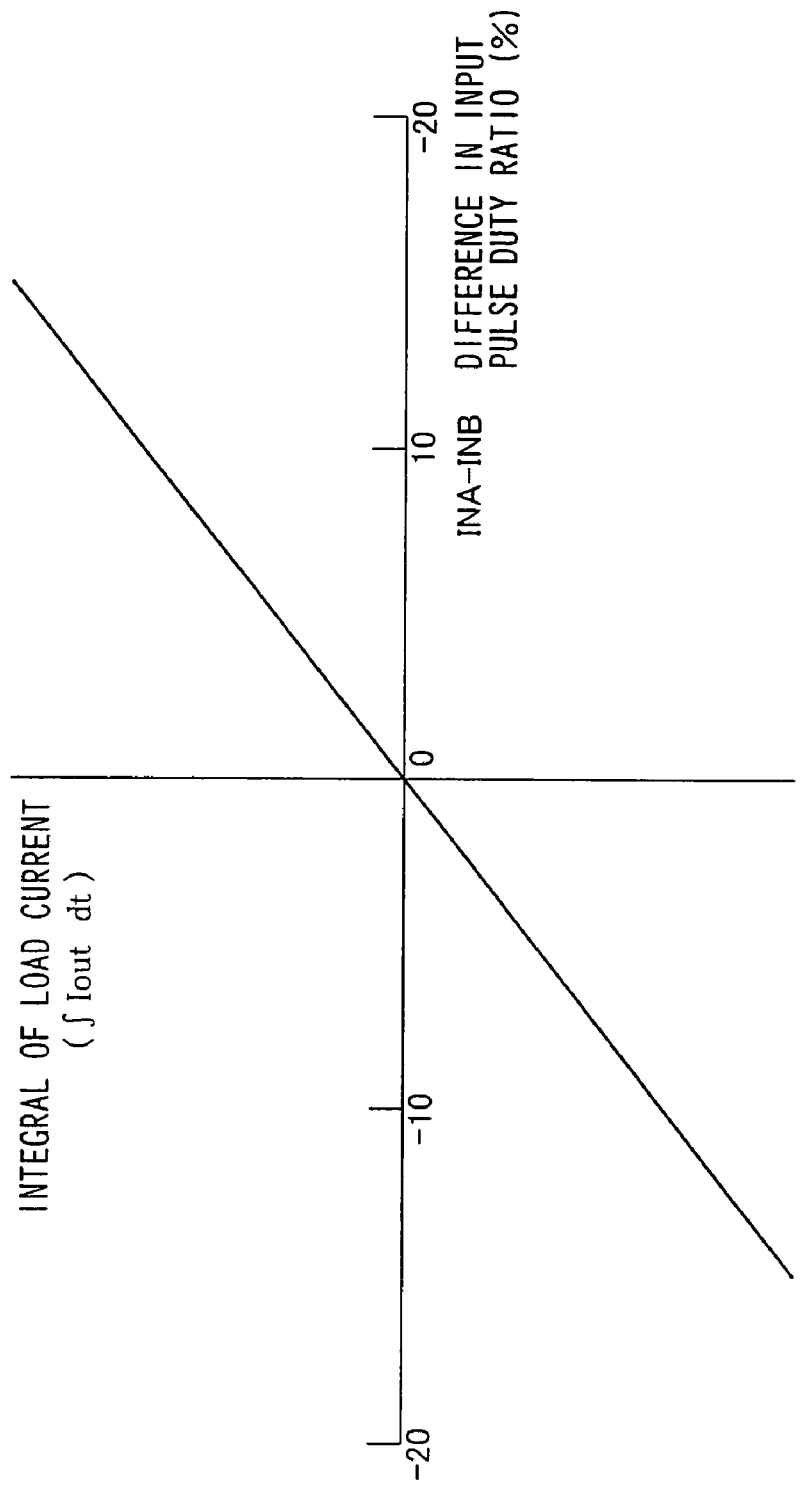
FIG. 6 is an input-output characteristic diagram of the present invention.
Figure 14:
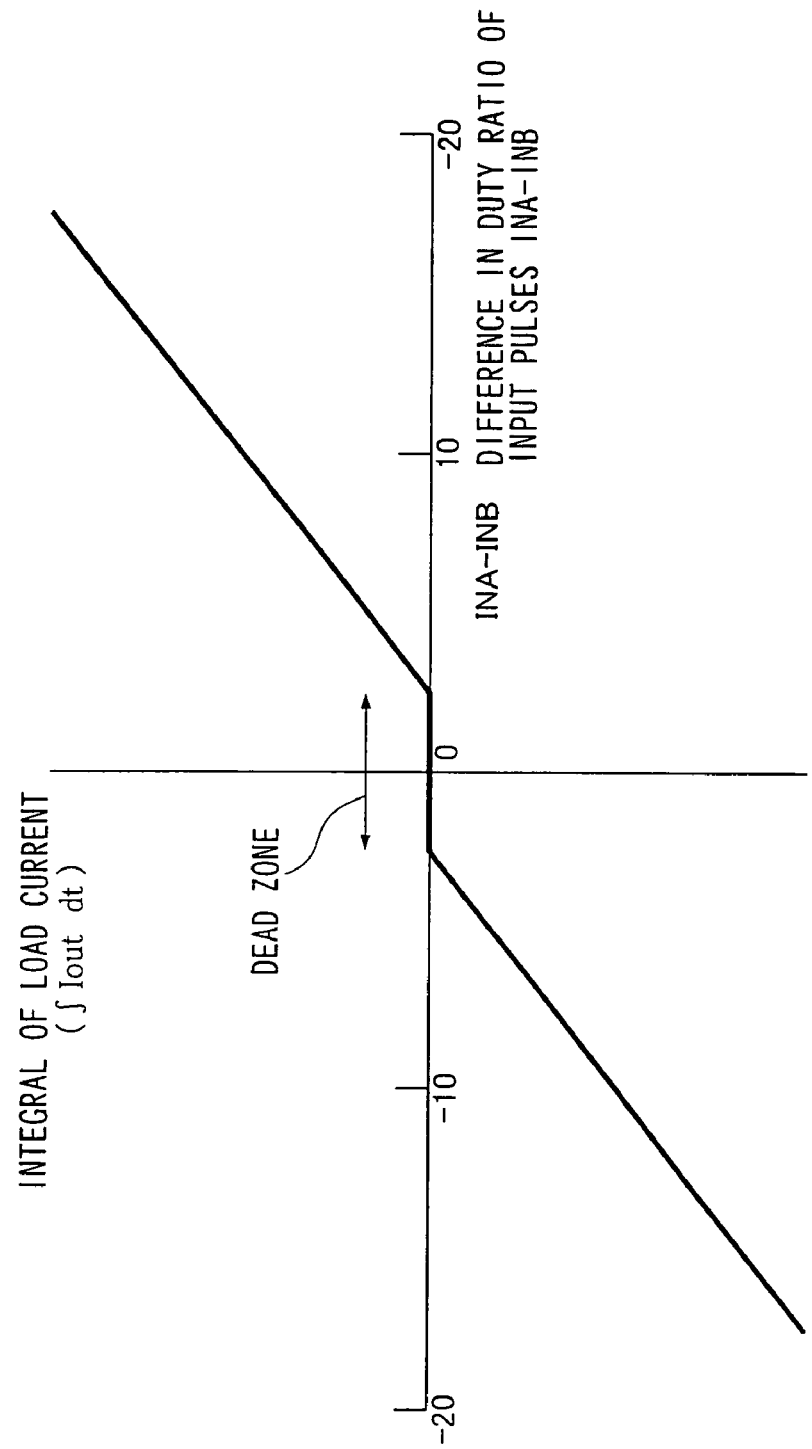
FIG. 14 is a conventional input-output characteristic diagram.

FIG. 14 shows the input-output characteristics of the conventional channel driver. The horizontal axis represents as a percent a difference in the duty ratio of the input pulses (INA and INB). The vertical axis represents the integral of a current passing through the load 3. The integral is a physical quantity equivalent to a torque output for driving the load of an actuator or the like. Since the conventional art has the dead times d1 and d2, when the time of an input pulse difference (INA−INB) becomes shorter than the dead time, the outputs (FO, RO) rise and fall at the same time. Current does not pass through the load in this input range and thus a dead zone appears around 0 input as shown in FIG. 14. On the other hand, (Embodiment 1) has a characteristic of dead time=0 in all input patterns and the dead zone does not appear even around 0 input as shown in FIG. 6. Hence, it is possible to solve a conventional problem, which is a low transmission gain of an input and output around 0 input, and linearly drive the load of an actuator or the like.

In this embodiment, the level of the input pulse on the opposite side is detected to control the timing pulse generators 1 and 5. The level of the output pulse on the opposite side may be detected to control the timing pulse generators 1 and 5.

Embodiment 2

Figure 7:
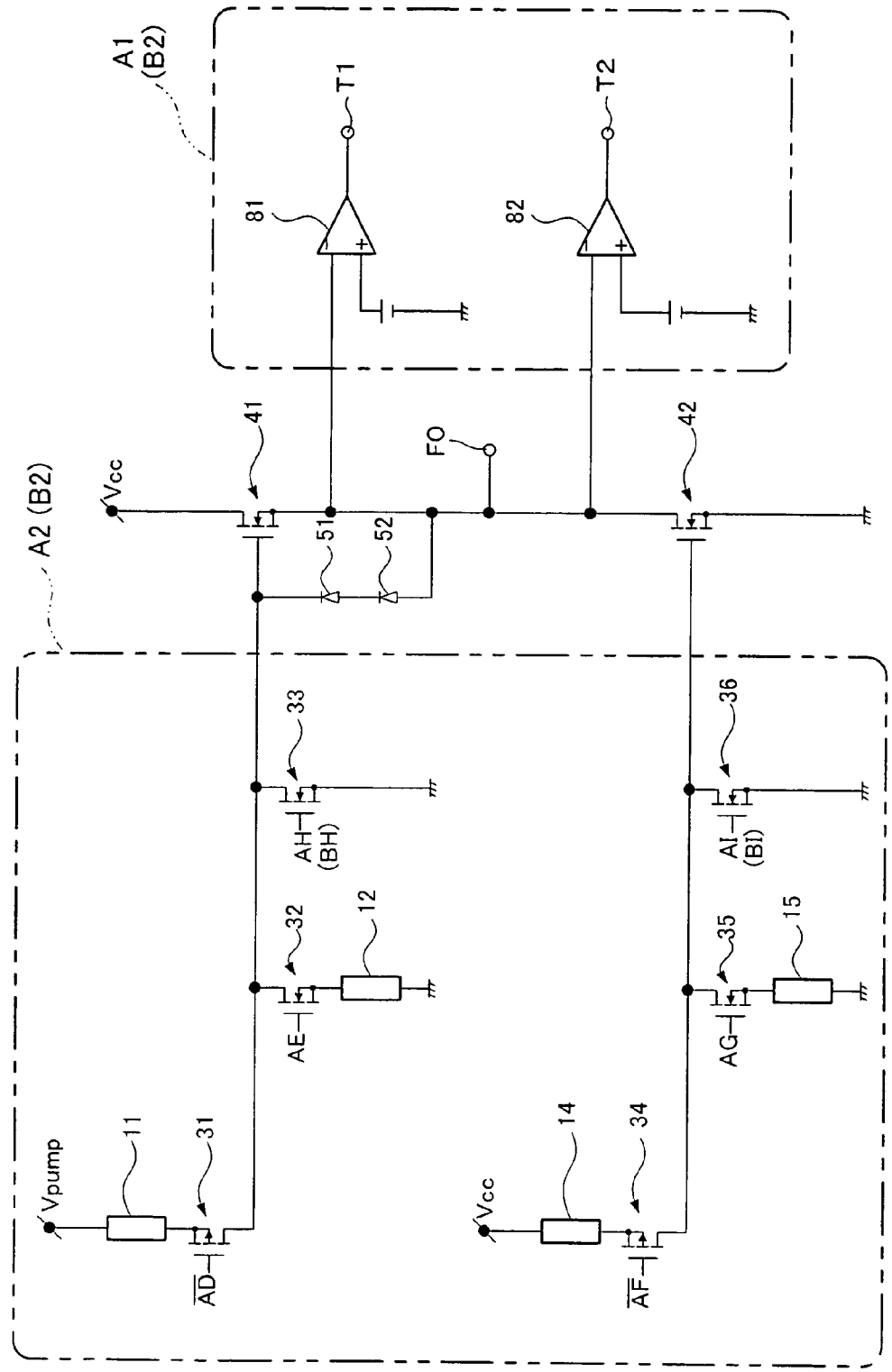
FIG. 7 is a diagram showing a driver circuit according to (Embodiment 2) of the present invention.

FIG. 7 is a circuit diagram showing a driver of (Embodiment 2).

The detector circuits A1 and B1 of (Embodiment 1) detect whether the input pulses INB and INA on the opposite side are set at "H" or "L", and then, the output pulses of the timing pulse generators 1 and 5 are controlled. In (Embodiment 2), a state of a channel driver on the opposite side is decided based on the output level of its own channel driver, and then, the output pulses of timing pulse generators 1 and 5 are controlled.

In FIG. 7, a detector circuit A1 for controlling a generation pulse for the timing pulse generator 1 of a first channel driver D1 is constituted of comparators 81 and 82. The comparator 81 detects a current passing through an upper output transistor 41 and outputs the current to an upper current detecting terminal T1, and the comparator 82 detects a current passing through a lower output transistor 42 and outputs the current to a lower current detecting terminal T2.

When a current passes through the upper output transistor 41, an output FO has a voltage drop equivalent to the product of an on-resistance and a current from a power supply (Vcc). When the voltage falls below a threshold voltage, it is decided that the current passes through the upper side. Driving pulses on side A are formed as in the case where an input pulse INB on the opposite side is set at "L".

Conversely, when a current passes through a lower output transistor 42, the output FO has a voltage equivalent to the product of an on-resistance and a current applied to the ground. When the voltage exceeds the threshold voltage, it is decided that the current passes through the lower side. Driving pulses on side A are formed as in the case where the input pulse INB on the opposite side is set at "H". That is, the same effect as (Embodiment 1) can be obtained by detecting a state of an output current on side A instead of side B (opposite side).

This embodiment described side A. Also on side B, the same effect as (Embodiment 1) can be obtained by making a decision based on the output level of its own channel driver instead of side A (opposite side) and controlling the output pulse of the timing pulse generator 5.

Embodiment 3

Figure 8:
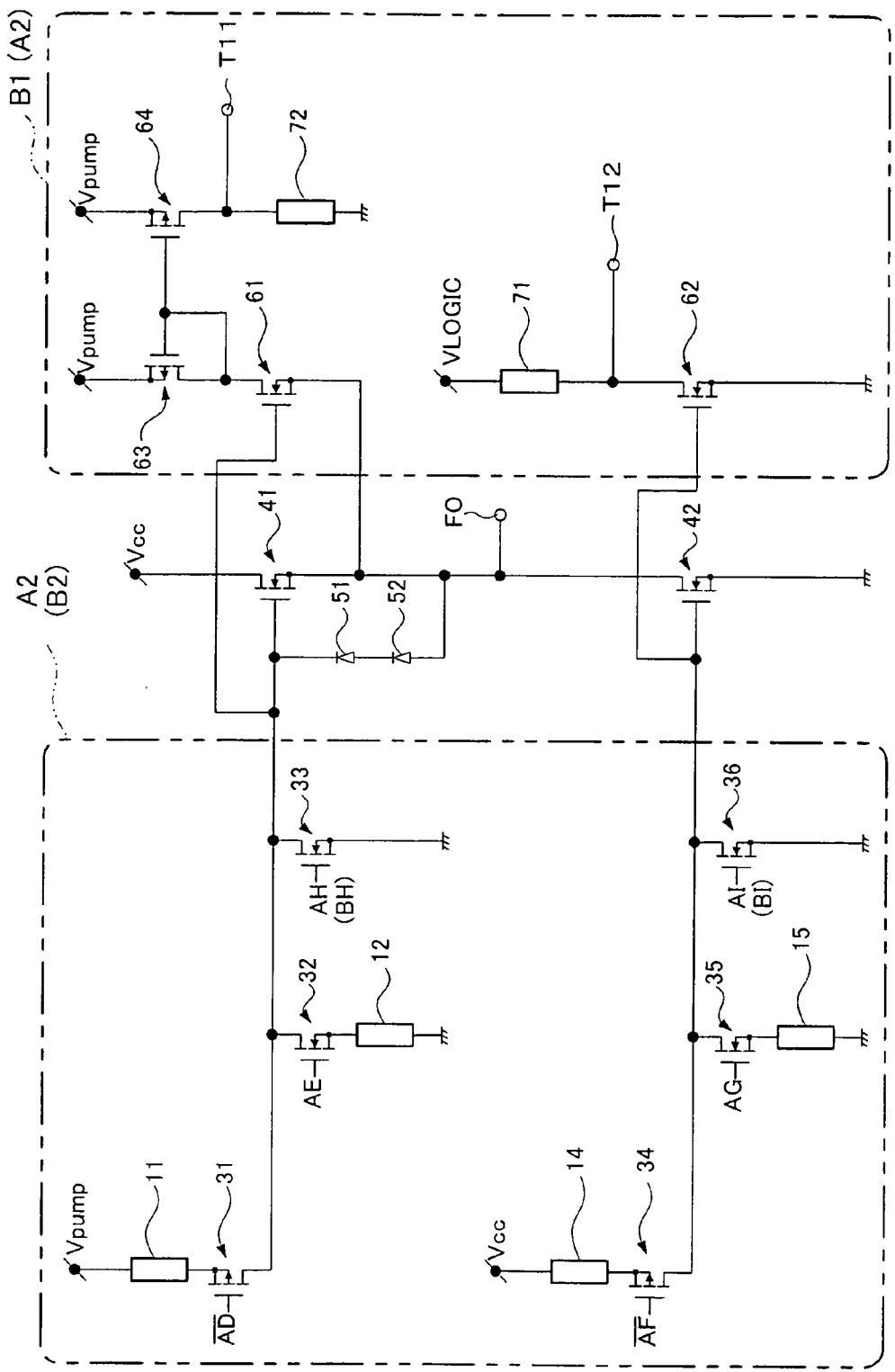
FIG. 8 is a diagram showing a driver circuit according to (Embodiment 3) of the present invention.

FIG. 8 is a circuit diagram showing a driver of (Embodiment 3).

The detector circuits A1 and A2 of (Embodiment 1) detect whether the input pulses INB and INA on the opposite side are set at "H" or "L" and the output pulses of the timing pulse generators 1 and 5 are controlled. In (Embodiment 3), a state of a channel driver on the opposite side is decided based on a state of a voltage between the gate and source of an upper output transistor 41 and a state of a voltage between the gate and source of a lower output transistor 42 on the opposite side, and the output pulses of timing pulse generators 1 and 5 are controlled.

In FIG. 8, a detector circuit B1 for controlling a generation pulse for the timing pulse generator 5 of a second channel driver D2 is constituted of transistors 61, 62, 63, 64 and so on.

The transistor 61 constitutes a mirror circuit with the upper output transistor 41, detects the voltage between the gate and source of the upper output transistor 41 through the transistors 63 and 64, which constitute another mirror circuit, and outputs the voltage to an upper gs detecting terminal T11. Reference numeral 72 denotes a resistor or a current source.

In reality, a chip size can be reduced by a smaller mirror ratio of the upper output transistor 41 and the transistor 61, so that the circuit can be designed without substantially increasing a chip area. When a current passes through the upper output transistor 41, the voltage between the gate and source of the upper output transistor 41 always exceeds a threshold voltage of the transistor, and thus an upper Vgs output terminal T11 is set at "H". At this point, it is decided that the current passes through the upper output transistor 41. Driving pulses on side B are formed as in the case where the input pulse INA is set at "H".

Conversely, the transistor 62 constitutes a mirror circuit with the lower output transistor 42, detects the voltage between the gate and source of the lower output transistor 42, and outputs the voltage to a lower gs detecting terminal T12. Reference numeral 71 denotes a resistor or a current source.

In reality, as on the upper side, a chip size can be reduced by a smaller mirror ratio of the upper output transistor 42 and the transistor 62. When a current passes through the lower output transistor 41, the voltage between the gate and source of the lower output transistor 41 always exceeds the threshold voltage of the output transistor 41. Thus, a lower vgs output terminal T12 is set at "L". At this point, it is decided that the current passes through the lower output transistor 41. Driving pulses on side B are formed as in the case where the input pulse INA is set at "L".

That is, the timing pulse generator 5 of the second channel driver D2 can obtain the same effect as (Embodiment 1) by detecting the voltage between the gate and source of each of the upper and lower output transistors on side A, which is the opposite side, instead of detecting the input pulse INA.

The driver circuits of the embodiments are used for a channel driver where an input-output relationship has a buffer function, that is, a PWM through function.

Embodiment 4

Figure 9:
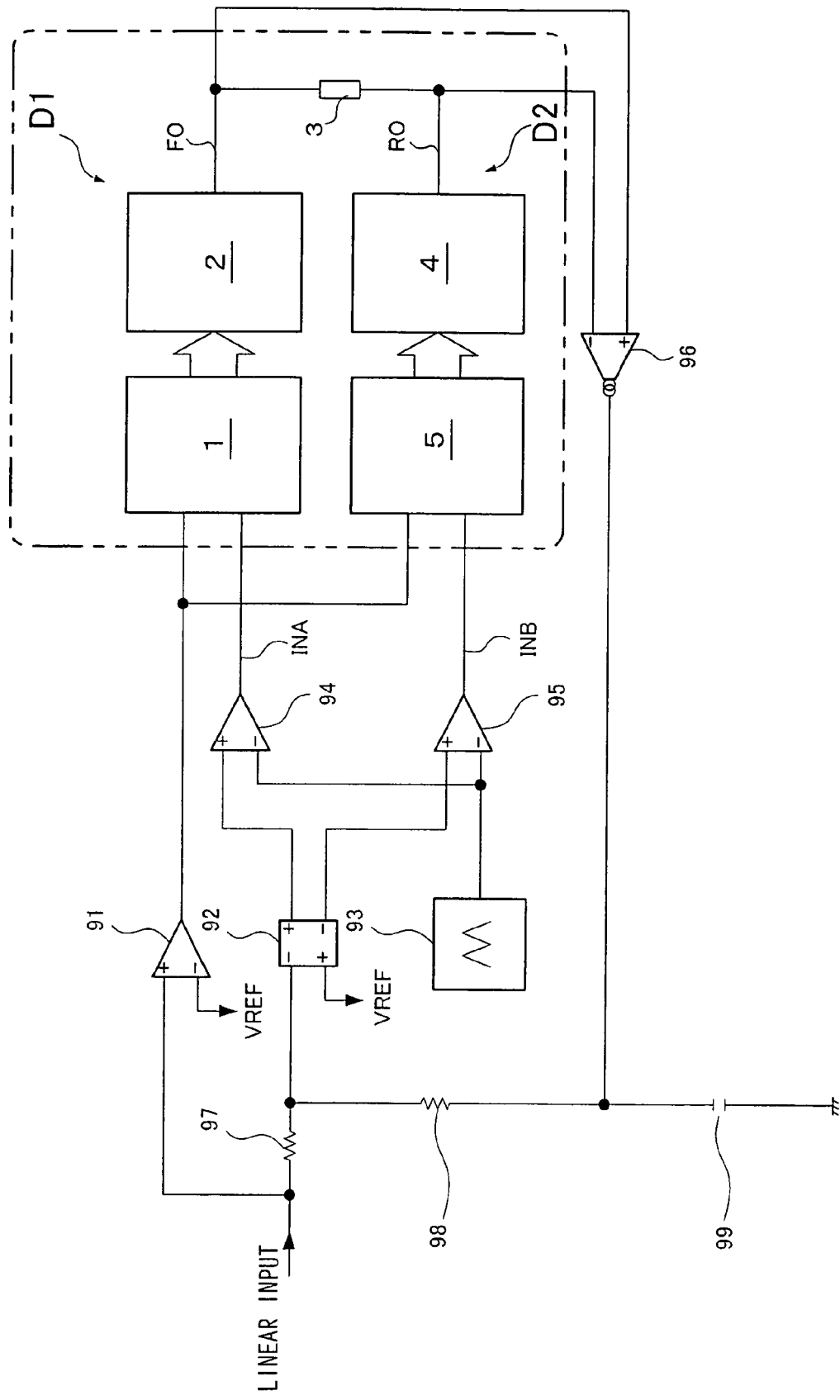
FIG. 9 is a block diagram showing a linear input PWM output driver according to (Embodiment 4) of the present invention.

FIG. 9 shows a linear input PWM output driver of (Embodiment 4).

The same constituent elements as the foregoing embodiments are indicated by the same reference numerals.

The linear input PWM output driver constituted of the driver circuit of any one of the foregoing embodiments is configured as below:

In FIG. 9, reference numeral 96 denotes a gm amplifier which converts, into a current, a voltage difference between a PWM output (FO) on side A on the node of upper and lower output transistors 41 and 42 of an output driver circuit 2 on side A and a PWM output (RO) on side B on the node of the upper and lower output transistors of an output driver circuit 4 on side B. The outputted current is smoothed in a capacitance 99 and is converted into a voltage.

Reference numerals 97 and 98 denote resistors for determining an overall loop gain, and reference character VREF denotes a reference voltage. Reference numeral 92 denotes an error amplifier having bipolar outputs.

The positive outputs of a triangular wave generator 93 and the error amplifier 92 are compared with each other by the comparator 94, so that a PWM pulse is generated. The generated PWM pulse is inputted to a timing pulse generator 1 on side A. Similarly, the negative outputs of the triangular wave generator 93 and the error amplifier 92 are compared with each other by the comparator 95, so that a PWM pulse is generated. The generated PWM pulse is inputted to a timing pulse generator 5 on side B.

The two PWM pulses generated thus are completely the same as the input pulses on side A and side B of FIG. 1, in which PWM through system is used. Therefore, as in PWM through system, driving pulses in FIGS. 3 to 5 are formed by the generated two PWM pulses, thereby achieving completely the same effect as PWM through system.

In this linear input format, instead of detecting a PWM input pulse on the opposite side, the comparator 91 is provided as a comparator for comparing a linear input voltage and a reference voltage (VREF). Thus, it is possible to obtain a function equivalent to the detection of a PWM output on the opposite side (INB). That is, when the linear input voltage is higher than the reference voltage, the driving pulse shown in FIG. 3 is inputted to the driver on side A and the driving pulse shown in FIG. 4 is inputted to the driver on side B. When the linear input voltage is lower than the reference voltage, a driving pulse is generated with side A and side B being interchanged with each other. When the linear input voltage is close to the reference voltage, almost the same pulse is generated on side A and side B as shown in FIG. 5. The same operations are performed as (Embodiment 1). Also in the driver with the linear input, it is possible to prevent a shoot-through current, adjust an output slew rate, and obtain preferred linearity as an input-output characteristic.

In the present invention, an N-channel transistor is used as an output transistor. It is self-evident that even when a P-channel transistor is used, the present invention is made effective by reversing the configuration for charging/discharging of the present invention.

When the comparator 91 is replaced with a window comparator and the linear input becomes close to the reference voltage, dead time may not be provided for the driving pulse for charging and discharging the output transistors on both sides, and the gates of the upper and lower transistors may be discharged more quickly.

Embodiment 5

Figure 10:
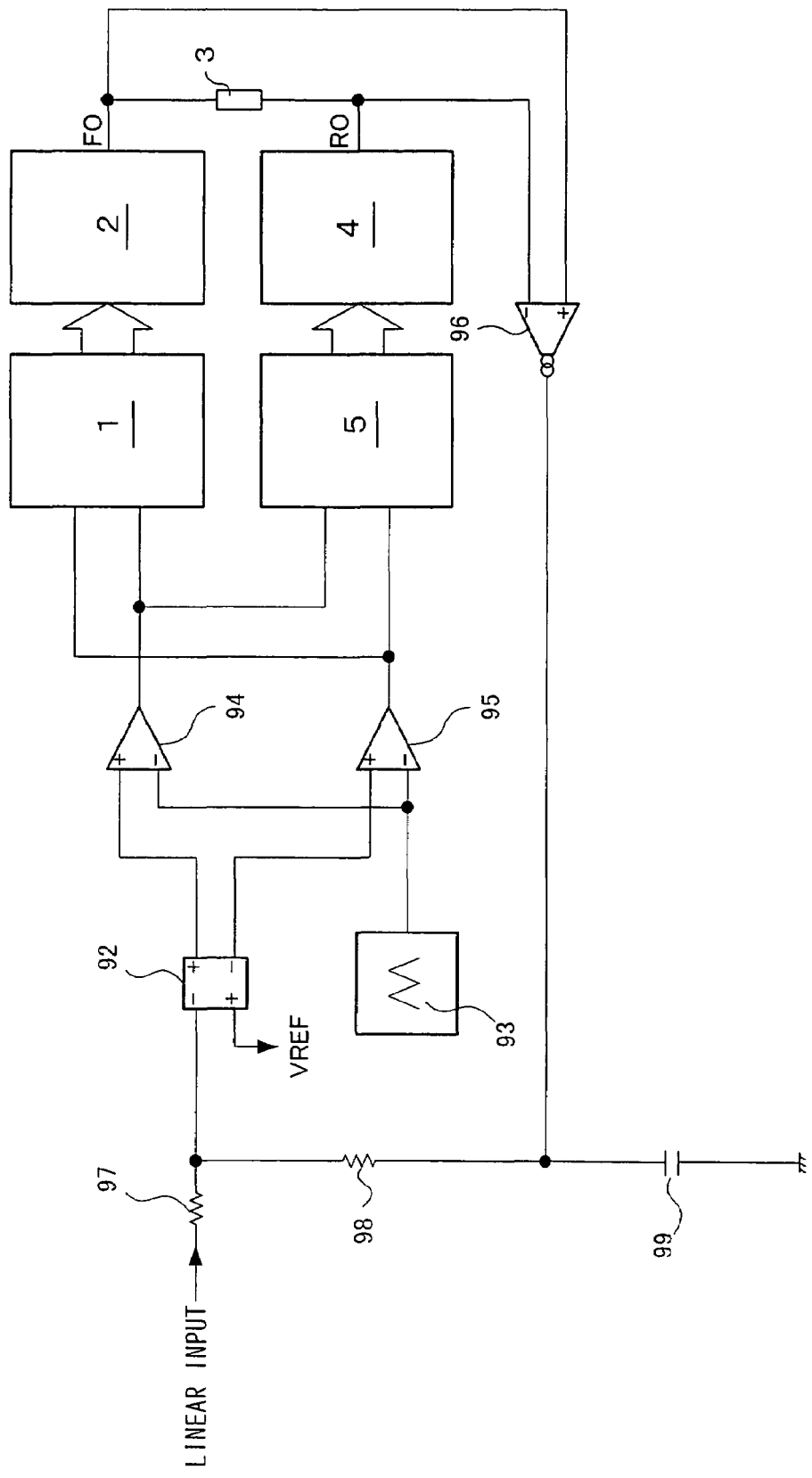
FIG. 10 is a block diagram showing a linear input PWM output driver according to (Embodiment 5) of the present invention.

FIG. 10 shows a liner input PWM output driver of (Embodiment 5).

(Embodiment 4) shown in FIG. 9 comprises, as a comparator, the comparator 91 or a window comparator serving as an alternative to the comparator 91. In (Embodiment 5), as shown in FIG. 10, the output of a comparator 94 is supplied to a timing pulse generator 5 and the output of a comparator 95 is supplied to a timing pulse generator 1, thereby eliminating the need for the comparator.

To be specific, a triangular wave and the positive output of the error amplifier 92 are compared with each other by the comparator 94 to generate a first PWM pulse. The triangular wave and the negative output of the error amplifier 92 are compared with each other by the comparator 95 to generate a second PWM pulse. The output of the comparator 94 is supplied as an input pulse INA to the timing pulse generator 1 of a first channel driver D1. The output of the comparator 95 is supplied as the other input pulse INB to the timing pulse generator 5 of a second channel driver D2. The output of the comparator 95 is supplied to the timing pulse generator 1 of the first channel driver D1 as information about a state of the second channel driver D2, and a change is made to a dead time period and a speed of charging/discharging the gates of the upper and lower output transistors of the first channel driver D1. The output of the comparator 94 is supplied to the timing pulse generator 5 of the second channel driver D2 as information about a state of the first channel driver D1, and a change is made to a dead time period and a speed of charging/discharging the gates of the upper and lower output transistors of the second channel driver D2.

What is claimed is:

1. A driver circuit for driving a load connected between an output of a first channel driver and an output of a second channel driver,
   the first and second channel drivers each comprising:
   a charging/discharging circuit comprising a switch transistor for charging and discharging each gate of upper and lower output transistors in response to a command from an input pulse, and a circuit for determining a charging/discharging speed for each gate; and
   a detector circuit for detecting a state of the channel driver on an opposite side,
   wherein a change is made to a dead time period and the speed of charging/discharging the gates of the upper and lower output transistors, according to the state of the channel driver on the opposite side,
   wherein
   the detector circuit detects a level of the input pulse on the opposite side,
   when the input pulse on the opposite side is set at "H", dead time is provided only at a rising edge of an input, the gate of the lower output transistor is discharged at a lower speed, and the gate of the upper output transistor is discharged at a higher speed, and
   when the input pulse on the opposite side is set at "L", the dead time is provided only at a falling edge of the input, the gate of the upper output transistor is discharged at a lower speed, and the gate of the lower output transistor is discharged at a higher speed.

2. The driver circuit according to claim 1, wherein
   the detector circuit detects a level of an output pulse on the opposite side,
   when the output pulse on the opposite side is set at "H", dead time is provided only at a rising edge of an input, the gate of the lower output transistor is discharged at a lower speed, and the gate of the upper output transistor is discharged at a higher speed, and
   when the output pulse on the opposite side is set at "L", the dead time is provided only at a falling edge of the input (output), the gate of the upper output transistor is discharged at a lower speed, and the gate of the lower output transistor is discharged at a higher speed.

3. The driver circuit according to claim 1, wherein
   the detector circuit detects a level of a voltage between the gate and source of each of the upper and lower output transistors on the opposite side,
   when the voltage between the gate and source of the upper output transistor is set at "H", dead time is provided only at a rising edge of the input pulse, the gate of the lower output transistor is discharged at a lower speed, and the gate of the upper output transistor is discharged at a higher speed, and
   when a voltage between the gate and source of the lower output transistor is set at "H", the dead time is provided only at a falling edge of the input pulse, the gate of the upper output transistor is discharged at a lower speed, and the gate of the lower output transistor is discharged at a higher speed.

4. The driver circuit according to claim 1, wherein it is detected that the input pulse or the output pulse has a duty close to 50% on both sides, no dead time is provided for a driving pulse for charging and discharging the output transistors on both sides, and the gates of the upper and lower output transistors on both sides are discharged at a higher speed.

5. A driver circuit for driving a load connected between an output of a first channel driver and an output of a second channel driver,
   the first and second channel drivers each comprising:
   a charging/discharging circuit comprising a switch transistor for charging and discharging each gate of upper and lower output transistors in response to a command from an input pulse, and a circuit for determining a charging/discharging speed for each gate; and
   a detector circuit for detecting a current passing through the upper and lower output transistors of its own channel driver, wherein a change is made to a dead time period and the speed of charging/discharging the gates of the upper and lower output transistors, according to a state of the current passing through the upper and lower output transistors,
   wherein when the detector circuit detects that a current of not lower than a specified value passes through the lower output transistor, dead time is provided at a rising edge of the input pulse, and the gate of the lower output transistor is discharged at a lower speed,
   when the detector circuit detects that a current of not lower than the specified value does not pass through the lower output transistor, no dead time is provided at the rising edge of the input pulse, and the gate of the lower output transistor is discharged at a higher speed,
   when the detector circuit detects that a current of not lower than the specified value passes through the upper output transistor, the dead time is provided at a falling edge of the input pulse, and the gate of the upper output transistor is discharged at a lower speed, and
   when the detector circuit detects that a current of not lower than the specified value does not pass through the upper output transistor, no dead time is provided at the falling edge of the input pulse, and the gate of the upper output transistor is discharged at a higher speed.

6. The driver circuit according to claim 5, wherein the detector circuit comprises a comparator for comparing an output voltage with a certain voltage, and makes a comparison between a threshold current and an output current calculated according to a logic that an output voltage is determined by a product of an on-resistance of an output transistor and an output current.

* * * * *